United States Patent
Shih et al.

(10) Patent No.: US 9,977,072 B2
(45) Date of Patent: May 22, 2018

(54) SEMICONDUCTOR STRUCTURE AND METHOD FOR OPERATING THE SAME

(71) Applicant: TAIWAN SEMICONDUCTOR MANUFACTURING COMPANY LTD., Hsinchu (TW)

(72) Inventors: Jiaw-Ren Shih, Hsin-Chu (TW); Jhong-Sheng Wang, Taichung (TW); Shih-Hsin Chen, Chiayi County (TW); Jen-Hao Lee, Taichung (TW); Ting-Sheng Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 137 days.

(21) Appl. No.: 14/954,566

(22) Filed: Nov. 30, 2015

(65) Prior Publication Data
US 2017/0153287 A1 Jun. 1, 2017

(51) Int. Cl.
G01R 31/00 (2006.01)
G01R 31/26 (2014.01)
G01R 31/28 (2006.01)

(52) U.S. Cl.
CPC ..... *G01R 31/2628* (2013.01); *G01R 31/2619* (2013.01); *G01R 31/2875* (2013.01)

(58) Field of Classification Search
CPC ............ G01R 31/2874; G01R 31/2886; G01R 31/2891; G01R 31/2862; G01R 31/2867; G01R 31/2875; G01R 31/2855; G01R 31/2879; H01L 23/467; H01L 23/3672; H01L 23/427; F28D 15/0233; F28D 15/0266; F28D 15/0275; F28D 19/02; B01J 19/30; B01J 2219/30207; F28C 3/14; F25B 2321/003
USPC ............ 324/750.03, 750.04, 750.09, 750.11; 165/80.3, 104.13–104.15, 104.18, 104.23, 165/104.24, 65, 66, 185
See application file for complete search history.

(56) References Cited

U.S. PATENT DOCUMENTS

| 8,400,178 B2* | 3/2013 | Pu ...................... G01R 31/2875 324/762.01 |
| 2010/0066399 A1* | 3/2010 | Kabbani ............... H01L 23/473 324/750.09 |

(Continued)

OTHER PUBLICATIONS

Ting-Kuo Kang, Chi-Shiun Wang, and Kuan-Cheng Su, "Self-Heating p-Channel Metal—Oxide—Semiconductor Field-Effect Transistors for Reliability Monitoring of Negative-Bias Temperature Instability," Japanese Journal of Applied Physics, vol. 46, No. 12, 2007, pp. 7639-7642.

(Continued)

*Primary Examiner* — Thang Le
(74) *Attorney, Agent, or Firm* — WPAT, P.C., Intellectual Property Attorneys; Anthony King

(57) ABSTRACT

An integrated circuit (IC) and a method for operating the IC are provided. The IC comprises a device under test and a first heater. The first heater is located at a first side of the device and provides heat to control a temperature of the device. The first heater comprises a semiconductor device having a first doped region and a second doped region having a conductivity type opposite to that of the first doped region, the first doped region interfacing with the second doped region.

20 Claims, 4 Drawing Sheets

(56) References Cited

U.S. PATENT DOCUMENTS

| | | | | |
|---|---|---|---|---|
| 2011/0121292 A1* | 5/2011 | Saether | ............... | H01L 23/345 257/48 |
| 2013/0340445 A1* | 12/2013 | Yosef | ...................... | F28F 3/12 62/62 |
| 2014/0043052 A1* | 2/2014 | Lindholm | ............ | H01L 23/345 324/750.03 |
| 2014/0140364 A1* | 5/2014 | Charles | ............... | G01K 15/005 374/1 |
| 2014/0253156 A1* | 9/2014 | Lo | ..................... | G01R 31/2875 324/750.07 |
| 2015/0377956 A1* | 12/2015 | McMahon | ......... | G01R 31/2875 324/750.03 |
| 2017/0103146 A1* | 4/2017 | Baumgartner | ...... | G06F 17/5009 |

OTHER PUBLICATIONS

Thomas Aichinger, Michael Nelhiebel, Sascha Einspieler, and Tibor Grasser, "In Situ Poly Heater—A Reliable Tool for Performing Fast and Defined Temperature Switches on Chip," IEEE Transaction on Device and Material Reliability, vol. 10, No. 1, Mar. 2010, pp. 3-8.

* cited by examiner

SEMICONDUCTOR STRUCTURE AND METHOD FOR OPERATING THE SAME

FIELD

The present disclosure relates generally to a semiconductor structure and more particularly relates to a semiconductor structure for providing heat.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, temperature provided to a device under test (DUT) during, for example, a reliability test is to be precisely controlled in order to fulfill the purpose of the test.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
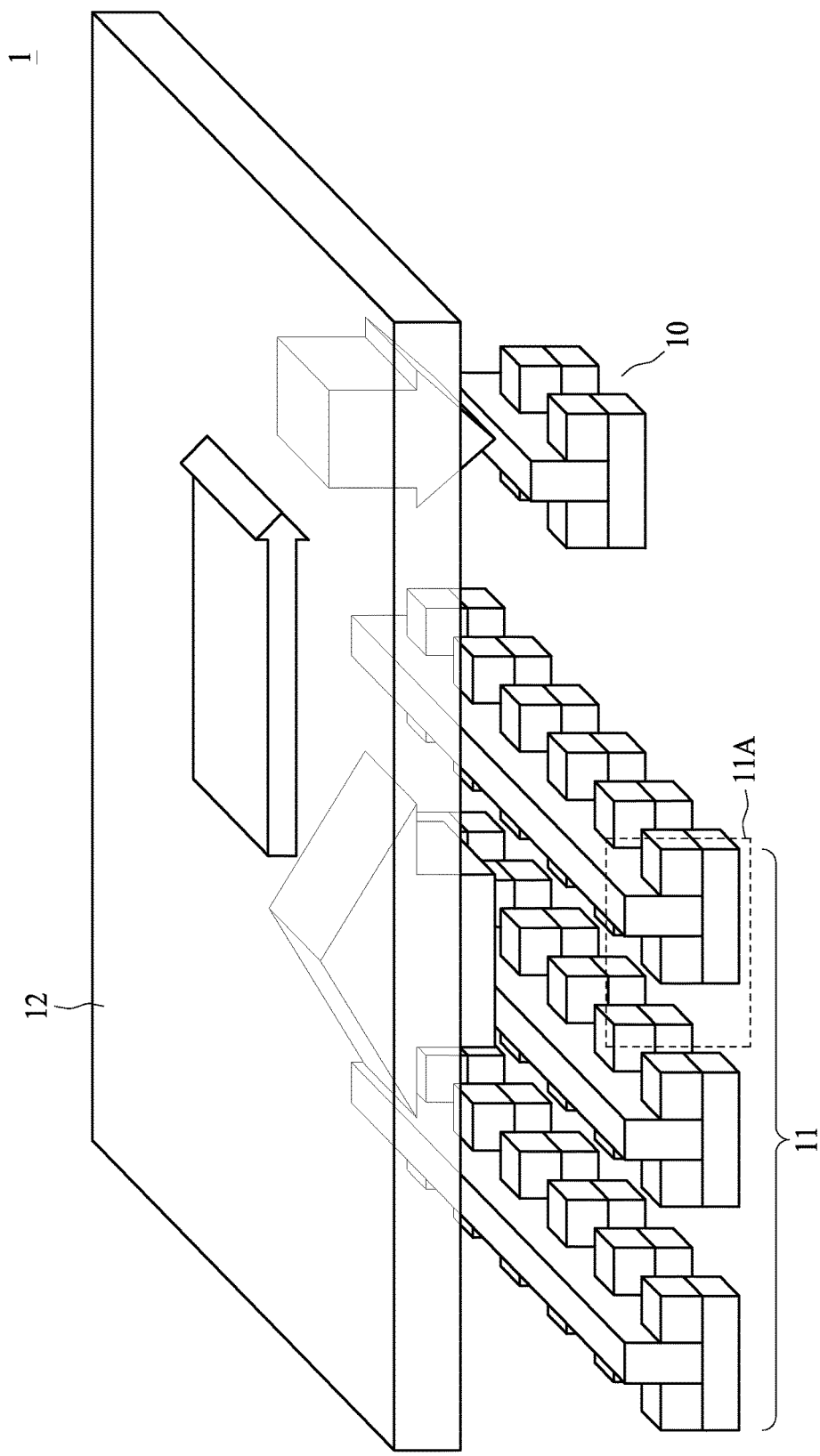
FIG. 1A is a schematic diagram illustrating an integrated circuit in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In reference to the drawings, FIG. 1A is a schematic diagram illustrating an integrated circuit (IC) 1 in accordance with one embodiment of the present disclosure. The IC 1 includes a device under testing (DUT) 10, a heater 11 and a thermally conductive pad 12.

The DUT 10 is integrated in the IC 1. In some embodiments, the DUT 10 can be any kind of semiconductor device, such as a Metal-Oxide-Semiconductor Field-Effect Transistor (MOSFET), a bipolar junction transistor (BJT), a multi-gate non-planar field effect transistor (e.g., FinFET), a capacitor, a resistor, an inductor or the combination thereof. The characterization (such as current, voltage, reliability, durability, responding time and the like) of the DUT 10 is tested under different temperature.

The heater 11 is located at one side of the DUT 10. The heater 11 is used to heat up the DUT 10. The IC 1 may include a sensor (not shown in the drawing) to detect the temperature of the DUT 10. The temperature of the DUT 10 can be adjusted by controlling the heater 11. In some embodiments, in order to uniformly heat up the DUT 10, the heater 11 can be located at more than sides of the DUT 10 or surround the DUT 10 based on the design requirement.

The heater 11 includes a plurality of FinFETs 11A. As shown in FIG. 1A, the heater 11 includes three rows of FinFET sets, each has six FinFETs. The number or the arrangement of the FinFETs can be changed based on the design requirement. In some embodiments, the heater 11 may include a diode, MOSFET, BJT or the combination thereof. The heat generated by the FinFET varies depending on the power (such as voltage or current) applied to the FinFET. In some embodiments, the heat provided by the FinFET is substantially proportional to the power applied to the FinFET. More power applying to the FinFET would result in more heat generated by the FinFET. In some embodiments, the test operation for the DUT 10 may include the following step: (i) applying a power to the FinFET to generate heat to heat up the DUT 10; (ii) checking whether the DUT 10 is operated under a predetermined temperature by the sensor; (iii) if so, maintaining the power applied to the FinFET, otherwise, adjusting the power applied to the FinFET to change the temperature of the DUT 10 until the DUT 10 is operated under the predetermined temperature; (iv) measuring the characterization of the DUT 20 under the predetermined temperature; and (v) repeating operations (i)-(iv) to measure the characterization of the DUT 20 under different predetermined temperatures.

In some embodiments, the power applied to the FinFET can be controlled by a control circuit (not shown in the drawing) integrated in the IC 1. The control circuit is connected to the sensor and received the information about the temperature of the DUT 10. The control circuit then adjusts the power applied to the FinFET based on the information received from the sensor. In some embodiments, the power applied to the FinFET can be control by a control circuit exterior to the IC 1.

The thermally conductive pad 12 is located over the heater 11 and the DUT 10. The thermally conductive pad 12 is used to transmit the heat generated by the heater 11 to the DUT 10. The thermally conductive pad 12 is made of any thermally conductive material, such as metal, alloy or other suitable materials. In some embodiments, the heat generated by the heater 11 can be transferred from the heater 11 to the DUT 10 directly and through the thermally conductive pad 12. Since the thermally conductive pad 12 has higher heat transfer coefficient than the dielectric layer or air between the heater 11 and the DUT 10, the thermally conductive pad 12 could facilitate the heat transfer, so that the DUT 10 can be heated more uniformly and quickly. By using the thermally conductive pad 12, it is allowed to transfer heat generated by the heater 11 to the DUT 10 more effectively even if the DUT 10 is distant from the heater 11.

Figure 1B:
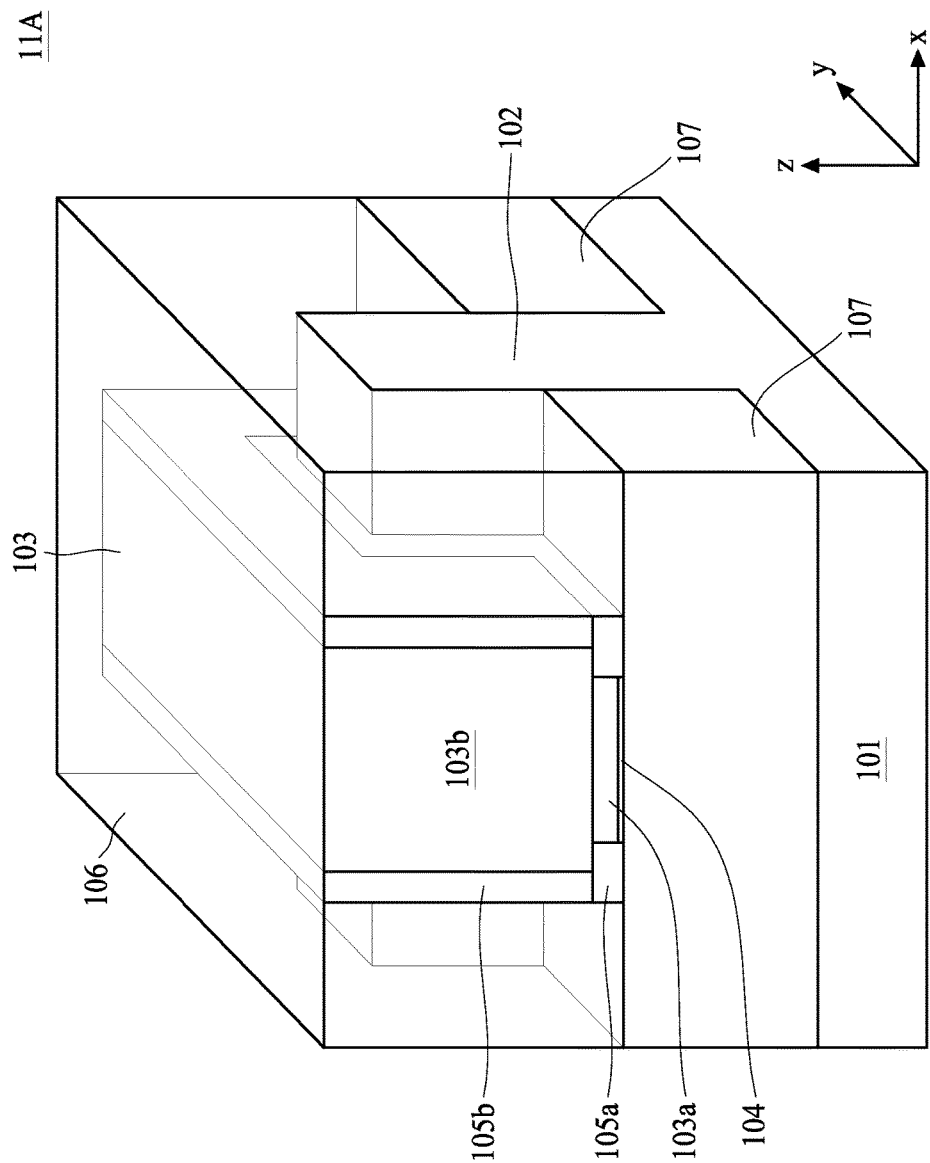
FIG. 1B illustrates a detailed structure of the semiconductor structure in FIG. 1A in accordance with one embodiment of the present disclosure.

FIG. 1B illustrates the detailed structure of the FinFET 11A shown in FIG. 1A, in accordance with some embodiments of the present disclosure. The FinFET 11A includes: a substrate 101, a fin structure 102, a gate structure 103, a high K dielectric layer 104, dielectric sidewalls 105a and 105b, an inter-layer dielectric (ILD) layer 106 and isolation features 107.

The substrate 101 is an underlying layer which provides support to the semiconductor structure 100. The substrate 101 may be a bulk silicon substrate, epitaxial silicon substrate, silicon germanium substrate, silicon carbide substrate, silicon germanium substrate, or other group III-V compound substrate.

The fin structure 102 is formed as a thin, planar structure protruding from the substrate 101 and extends along a first direction (x direction in FIG. 1B) and may be formed of the same material as the substrate 101. The fin structure 102 may include a source region, a drain region and a channel region (not shown). The source region and the drain region are separated by the channel region, which is wrapped-around by the gate structure 103. The width of the gate structure 103 (measured in the x direction in FIG. 1B) determines the effective channel length of the semiconductor structure 100. The wrap-around gate structure 103 provides a better electrical control and thus helps in reducing the leakage current and overcoming other short-channel effects.

The isolation feature 107 disposed on both sides of the fin structure 102 may be shallow trench isolation (STI) features that can prevent electrical current leakage between adjacent fin structures 102 (or adjacent semiconductor structures 100). The isolation feature 107 may be formed by the following steps: etching a pattern of trenches in the substrate 101, depositing one or more dielectric materials (such as silicon dioxide) to fill the trenches, and removing the excess dielectric thereby exposing the top of the fin structure 102. The isolation features 107 can be formed by, wet or dry thermal oxidation, physical vapor deposition (PVD), atomic layer deposition (ALD), high density plasma CVD (HDP-CVD), other suitable methods, and/or combinations thereof. In one embodiment, the isolation feature 107 may be formed of silicon dioxide. The isolation feature 107 may have a multilayer structure, for example, a thermal oxide liner layer with silicon oxide or silicon nitride formed over the liner.

The gate structure (gate electrode) 103 is arranged on the isolation features 107 to straddle the fin structure 102 and runs in a second direction (y direction in FIG. 1B) substantially perpendicular to the first direction, along which the fin structure 102 extends (x direction in FIG. 1B). The gate structure 103 can be formed of any suitable gate electrode material. In one exemplary embodiment, the gate structure 103 could be a metal gate electrode formed by, such as, but not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide. It should also be appreciated that the gate structure 103 needs not be a single material, but could include a composite stack of thin films.

The high K dielectric layer 104 is disposed between the fin structure 102 and the gate structure 103 and disposed between the isolation features 107 and the gate structure 103. The high K dielectric layer 104 can be formed from any gate dielectric material. In one embodiment, the high K dielectric layer 104 include a silicon dioxide, silicon oxynitride or a silicon nitride dielectric layer. The thickness of the high K dielectric layer 104 may be between about 5 Å to about 20 Å. The high K dielectric layer 104 may have a k value greater than about 7.0, and may include an oxide or a silicate of Hf, Al, Zr, La, Mg, Ba, Ti, Pb, and combinations thereof. Exemplary materials of the high K dielectric layer 104 include $MgO_x$, $BaTi_xO_y$, $BaSr_xTi_yO_z$, $PbTi_xO_y$, $PbZr_x Ti_yO_z$, and the like, with values X, Y, and Z being between 0 and 1. The high K dielectric layer 104 may be formed by Molecular-Beam Deposition (MBD), Atomic Layer Deposition (ALD), Physical Vapor Deposition (PVD), and the like.

The ILD layer 106 is used for electrical separation and features low dielectric constant k to minimize capacitive coupling. The ILD layer 106 may be formed by chemical vapor deposition (CVD), high density plasma CVD (HDP-CVD), spin-on deposition, physical vapor deposition (PVD or sputtering), or other suitable methods. The ILD layer 106 may include silicon oxide, silicon oxynitride, a low-k material, and/or other suitable dielectric. The ILD layer 106 may be formed on and surrounding the gate structure 103 and the fin structure 102.

According to one embodiment of the present disclosure, the gate structure 103 includes a first segment 103a and a second segment 103b. The second segment 103b is over the first segment 103a and is separated from the underlying fin structure 102 and isolation features 107 by the first segment 103a. The first segment 103a and the second segment 103b of the gate structure 103 may be formed using the same material or fabrication process. In one embodiment, the first segment 103a is sandwiched between dielectric sidewalls 105a and the second segment 103b is sandwiched between dielectric sidewalls 105b. In one embodiment, the dielectric sidewalls 105a may be silicon oxide sidewalls doped with group III or group V elements (group III element/dopant may include arsenic (As), phosphorous (P) or antimony (Sb) whereas group III dopants may include boron (B)). The concentration of the group III or group V element in the dielectric sidewalls 105a ranges from about 1E19 to about 1E22 atoms/cm$^3$. In one embodiment, the dielectric sidewalls 105b may be silicon oxide sidewalls doped with carbon or nitrogen with a concentration ranging from about 5E18 to about 1E21 atoms/cm$^3$.

In some embodiments, during the test operation for the DUT 10 in FIG. 1A, a first voltage is applied to the source region of the FinFET 11A, a second voltage is applied to the substrate of the FinFET 11A. In other words, the gate region of the FinFET is open. Alternatively, during the test operation for the DUT 10 in FIG. 1A, a first voltage is applied to the drain region of the FinFET 11A and a second voltage is applied to the gate region of the FinFET 11A. The current would flow from the drain region to the source region through the channel region to generate heat. In addition, heat can be generated by voltage difference between the p-n junction of the FinFET 11A, such as the junctions between the source/drain region and the substrate.

In some embodiments, a thermal wafer chuck can be used to heat up the DUT. However, the thermal wafer chuck cannot heat up the DUT within an effective time frame. In comparison with the thermal wafer chuck, the temperature of the FinFET can be adjusted rapidly by controlling the power applied to the FinFET, so as to heat up the DUT to a predetermined temperature in a more effective and a more reliable fashion. In some embodiments, a polysilicon heater can be used to heat up the DUT. However, the lifetime, the heat-generating stability, and the temperature-control sensitivity of the polysilicon heater are inferior to those of a semiconductor device heater, as described herein. Current flowing through the polysilicon heater would inevitably deteriorate the material structural integrity. However, in the present disclosure, current flowing through a metal gate of the FinFET, a channel of, for example, a MOS device, or through a p-n junction, therefore no structural damage would have been imposed on the semiconductor device heater proposed herein. A longer heater lifetime can be expected. Furthermore, self-heating characteristics of a semiconductor device and the correlation between the applied power and heat generated by the self-heating characteristics can be utilized to precisely control the temperature of the DUT. In comparison with the polysilicon heater, the FinFET is more stable and reliable due to its structure constraint. In addition, the use of FinFETs as a heater completely matches the FinFET CMOS process without extra effort, which would reduce the manufacturing cost.

Figure 2:
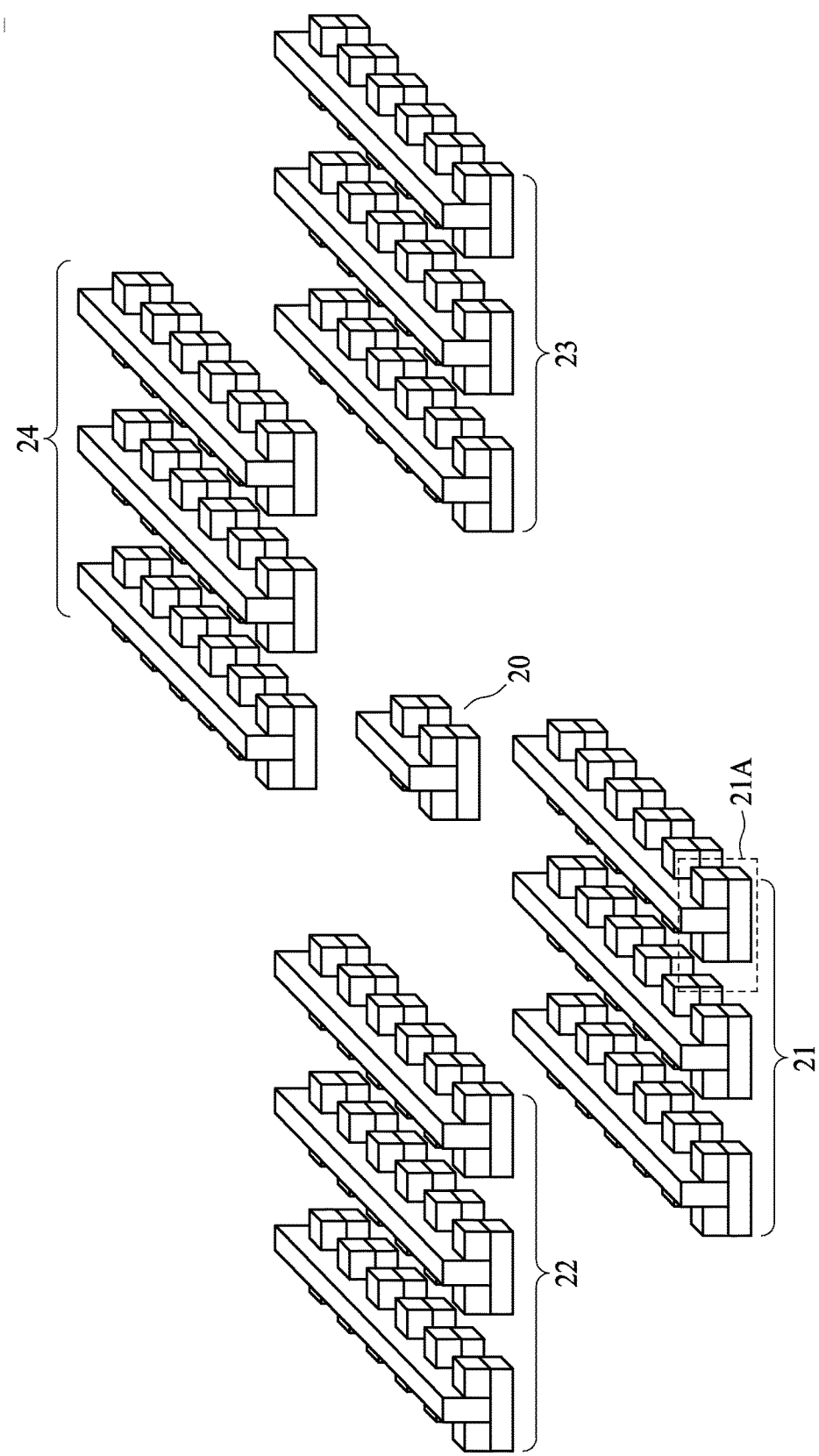
FIG. 2 is a schematic diagram illustrating an integrated circuit in accordance with one embodiment of the present disclosure.

In reference to the drawings, FIG. 2 is a schematic diagram illustrating an IC 2 in accordance with one embodiment of the present disclosure. The IC 2 includes a DUT 20 and heaters 21, 22, 23, 24.

The DUT 20 is integrated in the IC 2. In some embodiments, the DUT 20 can be any kind of semiconductor device, such as a MOSFET, a BJT, a FinFET, a capacitor, a resistor, an inductor or the combination thereof. The characterization (such as current, voltage, reliability, durability, responding time and the like) of the DUT 20 is tested under different temperature. The IC 2 may include a sensor (not shown in the drawing) to detect the temperature of the DUT 20.

The heaters 21, 22, 23 and 24 are located at four sides of the DUT 20 to surround the DUT 20. The heaters 21, 22, 23 and 24 are used to heat up the DUT 20. The temperature of the DUT 20 can be adjusted by controlling the heaters 21, 22, 23, 24. By arranging the heaters 21, 22, 23 and 24 to surround the DUT 20, the DUT 20 can be heated up uniformly.

Each heater 21, 22, 23, 24 includes a plurality of FinFETs 21A. As shown in FIG. 2, each heater 21, 22, 23, 24 includes three rows of FinFET sets, each has six FinFETs. The number or the arrangement of the FinFETs can be changed based on the design requirement. In some embodiments, the heaters 21, 22, 23, 24 may include a diode, MOSFET, BJT or the combination thereof. The heat generated by the FinFET varies depending on the power (such as voltage or current) applied to the FinFET. In some embodiments, the heat provided by the FinFET is substantially proportional to the power applied to the FinFET. More power applying to the FinFET would result in more heat generated by the FinFET. In some embodiments, the test operation for the DUT 20 may include the following step: (i) applying a power to the FinFET to generate heat to heat up the DUT 20; (ii) checking whether the DUT 20 is operated under a predetermined temperature by the sensor; (iii) if so, maintaining the power applied to the FinFET, otherwise, adjusting the power applied to the FinFET to change the temperature of the DUT 20 until the DUT 20 is operated under the predetermined temperature; (iv) measuring the characterization of the DUT 20 under the predetermined temperature; and (v) repeating operations (i)-(iv) to measure the characterization of the DUT 20 under different predetermined temperatures.

In some embodiments, the power applied to the FinFET can be controlled by a control circuit (not shown in the drawing) integrated in the IC 2. The control circuit is connected to the sensor and received the information about the temperature of the DUT 20. The control circuit then adjusts the power applied to the FinFET based on the information received from the sensor. In some embodiments, the power applied to the FinFET can be control by a control circuit exterior to the IC 2.

Since the IC 2 shown in FIG. 2 does not include thermally conductive pads over the heater 21, 22, 23, 24, the heat is transferred from the heater 21, 22, 23, 24 to the DUT 20 through the dielectric layer or air between the heater 21, 22, 23, 24 and the DUT 20. Without the use of the thermally conductive pads, the routing of the IC 2 is simpler than that of the IC 1 shown in FIG. 1, and thus the total area of the IC 2 can be reduced.

In some embodiments, during the test operation for the DUT 20 in FIG. 2, a first voltage is applied to the source region of the FinFET 21A, a second voltage is applied to the substrate of the FinFET 21A. In other words, the gate region of the FinFET is open. Alternatively, during the test operation for the DUT 20 in FIG. 2, a first voltage is applied to the drain region of the FinFET 21A and a second voltage is applied to the gate region of the FinFET 21A. The current would flow from the drain region to the source region through the channel region to generate heat. In addition, heat can be generated by voltage difference between the p-n junction of the FinFET 21A, such as the junctions between the source/drain region and the substrate.

In some embodiments, a thermal wafer chuck can be used to heat up the DUT. However, the thermal wafer chuck cannot heat up the DUT within an effective time frame. In comparison with the thermal wafer chuck, the temperature of the FinFET can be adjusted rapidly by controlling the power applied to the FinFET, so as to heat up the DUT to a predetermined temperature in a more effective and a more reliable fashion. In some embodiments, a polysilicon heater can be used to heat up the DUT. However, the lifetime, the heat-generating stability, and the temperature-control sensitivity of the polysilicon heater are inferior to those of a semiconductor device heater, as described herein. Current flowing through the polysilicon heater would inevitably deteriorate the material structural integrity. However, in the present disclosure, current flowing through a metal gate of the FinFET, a channel of, for example, a MOS device, or through a p-n junction, therefore no structural damage would have been imposed on the semiconductor device heater proposed herein. A longer heater lifetime can be expected. Furthermore, self-heating characteristics of a semiconductor device and the correlation between the applied power and heat generated by the self-heating characteristics can be utilized to precisely control the temperature of the DUT. In comparison with the polysilicon heater, the FinFET is more stable and reliable due to its structure constraint. In addition, the use of FinFETs as a heater completely matches the FinFET CMOS process without extra effort, which would reduce the manufacturing cost.

Figure 3:
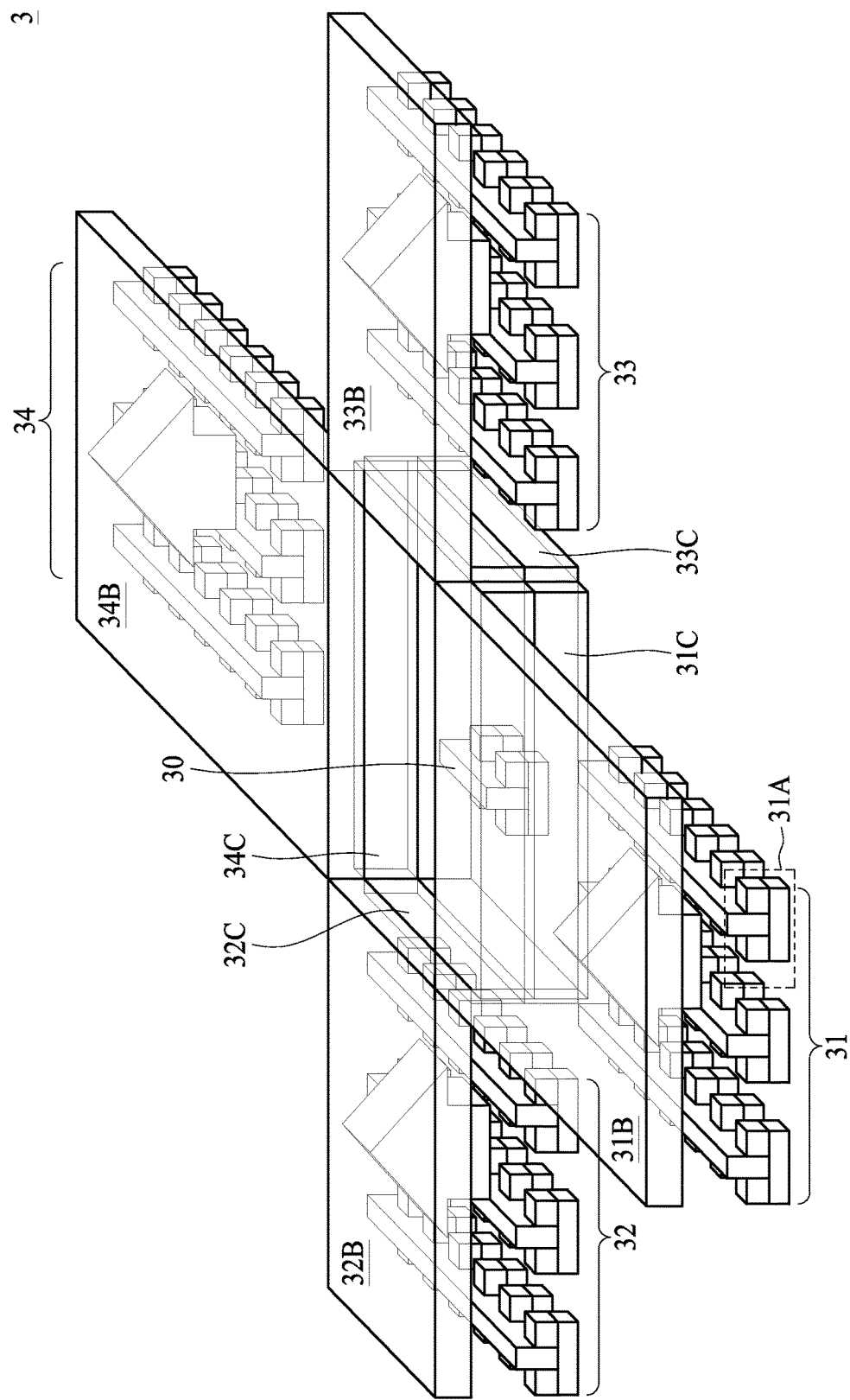
FIG. 3 is a schematic diagram illustrating an integrated circuit in accordance with one embodiment of the present disclosure.

In reference to the drawings, FIG. 3 is a schematic diagram illustrating an IC 3 in accordance with one embodiment of the present disclosure. The IC 3 includes a DUT 30, heaters 31, 32, 33, 34 and thermally conductively pads 31B, 31C, 32B, 32C, 33B, 33C, 34B, 34C.

The DUT 30 is integrated in the IC 3. In some embodiments, the DUT 30 can be any kind of semiconductor device, such as a MOSFET, a BJT, a FinFET, a capacitor, a resistor, an inductor or the combination thereof. The characterization (such as current, voltage, reliability, durability, responding time and the like) of the DUT 30 is tested under different temperature. The IC 3 may include a sensor (not shown in the drawing) to detect the temperature of the DUT 30.

The heaters 31, 32, 33 and 34 are located at four sides of the DUT 30 to surround the DUT 30. The heaters 31, 32, 33 and 34 are used to heat up the DUT 30. The temperature of the DUT 30 can be adjusted by controlling the heaters 31, 32, 33, 34. By arranging the heaters 31, 32, 33 and 34 to surround the DUT 30, the DUT 30 can be heated up uniformly.

Each heater 31, 32, 33, 34 includes a plurality of FinFETs 31A. As shown in FIG. 3, each heater 31, 32, 33, 34 includes three rows of FinFET sets, each has six FinFETs. The number or the arrangement of the FinFETs can be changed based on the design requirement. In some embodiments, the heaters 31, 32, 33, 34 may include a diode, MOSFET, BJT or the combination thereof. The heat generated by the FinFET varies depending on the power (such as voltage or current) applied to the FinFET. In some embodiments, the heat provided by the FinFET is substantially proportional to the power applied to the FinFET. More power applying to the FinFET would result in more heat generated by the FinFET. In some embodiments, the test operation for the DUT 30 may include the following step: (i) applying a power to the FinFET to generate heat to heat up the DUT 30; (ii) checking whether the DUT 30 is operated under a predetermined temperature by the sensor; (iii) if so, maintaining the power applied to the FinFET, otherwise, adjusting the power applied to the FinFET to change the temperature of the DUT 30 until the DUT 30 is operated under the predetermined temperature; (iv) measuring the characterization of the DUT 30 under the predetermined temperature; and (v) repeating operations (i)-(iv) to measure the characterization of the DUT 30 under different predetermined temperatures.

In some embodiments, the power applied to the FinFET can be controlled by a control circuit (not shown in the drawing) integrated in the IC 3. The control circuit is connected to the sensor and received the information about the temperature of the DUT 30. The control circuit then adjusts the power applied to the FinFET based on the information received from the sensor. In some embodiments, the power applied to the FinFET can be control by a control circuit exterior to the IC 3.

The thermally conductive pads 31B, 32B, 33B, 34B are located over the heaters 31, 32, 33, 34 respectively. The thermally conductive pads 31C, 32C, 33C, 34C are located between the DUT 30 and the heaters 31, 32, 33, 34 respectively and surround the DUT 30. The thermally conductive pads 31C, 32C, 33C, 34C are connected with the thermally conductive pads 31B, 32B, 33B, 34B respectively. The thermally conductive pads 31B, 31C, 32B, 32C, 33B, 33C, 34B, 34C are used to transmit the heat generated by the heaters 31, 32, 33, 34 to the DUT 30. In some embodiments, the heat generated by the heaters 31, 32, 33, 34 can be transferred from the heaters 31, 32, 33, 34 to the thermally conductive pads 31C, 32C, 33C, 34C through the dielectric layer or air and through the thermally conductive pads 31B, 32B, 33B, 34B. The thermally conductive pads 31B, 31C, 32B, 32C, 33B, 33C, 34B, 34C are made of any thermally conductive material, such as metal, alloy or other suitable materials. In some embodiments, the material of the thermally conductive pads 31C, 32C, 33C, 34C can be same as that of the thermally conductive pads 31B, 32B, 33B, 34B. Alternatively, the material of the thermally conductive pads 31C, 32C, 33C, 34C is different from that of the thermally conductive pads 31B, 32B, 33B, 34B. Since the thermally conductive pads has higher heat transfer coefficient than the dielectric layer or air between the heaters 31, 32, 33, 34 and the DUT 30, the thermally conductive pads could facilitate the heat transfer, so that the DUT 30 can be heated more uniformly and quickly.

In some embodiments, during the test operation for the DUT 30 in FIG. 3, a first voltage is applied to the source region of the FinFET 31A, a second voltage is applied to the substrate of the FinFET 31A. In other words, the gate region of the FinFET is open. Alternatively, during the test operation for the DUT 30 in FIG. 3, a first voltage is applied to the drain region of the FinFET 31A and a second voltage is applied to the gate region of the FinFET 31A. The current would flow from the drain region to the source region through the channel region to generate heat. In addition, heat can be generated by voltage difference between the p-n junction of the FinFET 31A, such as the junctions between the source/drain region and the substrate.

In some embodiments, a thermal wafer chuck can be used to heat up the DUT. However, the thermal wafer chuck cannot heat up the DUT within an effective time frame. In comparison with the thermal wafer chuck, the temperature of the FinFET can be adjusted rapidly by controlling the power applied to the FinFET, so as to heat up the DUT to a predetermined temperature in a more effective and a more reliable fashion. In some embodiments, a polysilicon heater can be used to heat up the DUT. However, the lifetime, the heat-generating stability, and the temperature-control sensitivity of the polysilicon heater are inferior to those of a semiconductor device heater, as described herein. Current flowing through the polysilicon heater would inevitably deteriorate the material structural integrity. However, in the present disclosure, current flowing through a metal gate of the FinFET, a channel of, for example, a MOS device, or through a p-n junction, therefore no structural damage would have been imposed on the semiconductor device heater proposed herein. A longer heater lifetime can be expected. Furthermore, self-heating characteristics of a semiconductor device and the correlation between the applied power and heat generated by the self-heating characteristics can be utilized to precisely control the temperature of the DUT. In comparison with the polysilicon heater, the FinFET is more stable and reliable due to its structure constraint. In addition, the use of FinFETs as a heater completely matches the FinFET CMOS process without extra effort, which would reduce the manufacturing cost.

In view of the above, the present disclosure provides a stable and reliable heat source to heat up a device under test, so as to precisely measure the characterization of the device at different temperature.

One embodiment of the present disclosure provides an integrated circuit (IC). The IC comprises a device under test and a first heater. The first heater is located at a first side of the device and provides heat to control a temperature of the device. The first heater comprises a semiconductor device having a first doped region and a second doped region having a conductivity type opposite to that of the first doped region, the first doped region interfacing with the second doped region.

One embodiment of the present disclosure provides a semiconductor device. The semiconductor device comprises a device under test and a first set of FinFETs. The first set of FinFETs is located at a first side of the device to heat up the device. The heat generated by the first set FinFETs is controlled by a power applied to each FinFETs.

One embodiment of the present disclosure provides a method for controlling a temperature of a device. The method comprises providing the device and arranging a first set of FinFETs at a first side of the device to heat up the device, wherein the heat generated by the first set FinFETs is controlled by a power applied to each FinFETs.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. An integrated circuit, comprising:
    a device under test;
    a first heater located at a first side of the device under test and providing heat to control a temperature of the device under test, wherein the first heater comprises a semiconductor device having a first doped region and a second doped region having a conductivity type opposite to that of the first doped region, the first doped region interfacing with the second doped region;
    a first thermally conductively pad over the first heater;
    a second thermally conductively pad located between the device under test and the first heater; and
    a second set of thermally conductively pads surrounding the device under test, wherein the first thermally conductively pad and the second thermally conductively pad are connected with the second set of thermally conductively pads.

2. The integrated circuit of claim 1, wherein the semiconductor device comprises a Metal-Oxide-Semiconductor Field-Effect Transistors (MOSFET), a bipolar junction transistor (BJT) or a multi-gate non-planar field effect transistor (FinFET).

3. The integrated circuit of claim 1, wherein the heat provided by the first heater is controlled based on a difference between a first voltage applied to the first doped region and a second voltage applied to the second doped region.

4. The integrated circuit of claim 2, wherein the heat provided by the first heater is controlled based on the current flowing through a channel of the MOSFET, the BJT or the FinFET.

5. The integrated circuit of claim 1, further comprising a second heater located at a second side of the device under test and providing heat to the device under test.

6. The integrated circuit of claim 1, further comprising a second heater, a third heater and a fourth heater to surround the device under test and providing heat to the device under test.

7. The integrated circuit of claim 6, wherein the first thermally conductively pad is over the second heater, the third heater and the fourth heater.

8. The integrated circuit of claim 7, wherein the second set of thermally conductively pads, are further located between the device under test and the second heater, the device under test and the third heater, and the device under test and the fourth heater.

9. The integrated circuit of claim 1, further comprising a sensor to detect the temperature of the device under test.

10. The integrated circuit of claim 9, further comprising a temperature controller to receive the signal from the sensor and to control the heat generated by the first heater based on the received signal.

11. The semiconductor device of claim 1, wherein the first thermally conductive pad is physically connected to the second set of thermally conductively pad.

12. A semiconductor device, comprising:
    a device under test;
    a first set of FinFETs located at a first side of the device under test to heat up the device under test, wherein the heat generated by the first set FinFETs is controlled by a power applied to each FinFETs;
    one of a first set of thermally conductive pads located over the first set of FinFETs; and
    one of a second set of thermally conductive pads located between the device under test and the first set of FinFETs.

13. The semiconductor device of claim 12, further comprising a second set of FinFETs, a third set of FinFETs and a fourth set of FinFETs surrounding the device under test and to heat up the device under test.

14. The semiconductor device of claim 13, wherein
    the first set of thermally conductive pads further located over the second set of FinFETs, the third set of FinFETs and the fourth set of FinFETs; and
    the second set of thermally conductive pads further located between the device under test and the second set of FinFETs, the device under test and the third set of FinFETs, and the device under test and the fourth set of FinFETs.

15. The semiconductor device of claim 12, wherein the one of the first set of thermally conductive pads is physically connected to the one of the second set of thermally conductive pads.

16. A method for controlling a temperature of a device, comprising:
    providing the device; and
    arranging a first set of FinFETs at a first side of the device to heat up the device, wherein the heat generated by the first set FinFETs is controlled by a power applied to each FinFETs;
    providing one of a first set of thermally conductive pads over the first set of FinFETs; and
    providing one of a second set of thermally conductive pads between the device and the first set of FinFETs.

17. The method of claim 16, further comprising arranging a second set of FinFETs, a third set of FinFETs and a fourth set of FinFETs to surround the device and to heat up the device.

18. The method of claim 17, wherein
providing others of the first set of thermally conductive pads over the second set of FinFETs, the third set of FinFETs and the fourth set of FinFETs; and
providing others of the second set of thermally conductive pads between the device and the second set of FinFETs, the device and the third set of FinFETs, and the device and the fourth set of FinFETs.

19. The method of claim 16, further comprising:
measuring a temperature of the device; and
increasing a power applied to each FinFET if the measured temperature is less than a predetermined value, or decreasing a power applied to each FinFET if the measured temperature is higher than a predetermined value.

20. The semiconductor device of claim 16, wherein the one of the first set of thermally conductive pads is physically connected to the one of the second set of thermally conductive pads.

\* \* \* \* \*